United States Patent [19]

Yiu

[11] Patent Number: 5,117,389
[45] Date of Patent: May 26, 1992

[54] FLAT-CELL READ-ONLY-MEMORY INTEGRATED CIRCUIT

[75] Inventor: Tom D. H. Yiu, Milpitas, Calif.

[73] Assignee: Macronix International Co., Ltd., Taiwan, China

[21] Appl. No.: 577,644

[22] Filed: Sep. 5, 1990

[51] Int. Cl.⁵ .............................................. G11C 17/10
[52] U.S. Cl. ................................. 365/104; 365/178; 365/184; 357/23.12; 357/45
[58] Field of Search .............. 365/104, 178, 182, 185, 365/184; 357/23, 12, 45

[56] References Cited

U.S. PATENT DOCUMENTS

| 4,145,701 | 3/1979 | Kawagoe | 357/45 |
| 4,328,563 | 5/1982 | Schroeder | 365/104 |
| 4,342,100 | 7/1982 | Kuo | 365/104 |
| 4,384,345 | 5/1983 | Mikome | 365/104 |
| 4,404,654 | 9/1983 | Kamuro et al. | 365/103 |
| 4,459,687 | 7/1984 | Shiotari et al. | 365/182 |
| 4,482,822 | 11/1984 | Kamuro et al. | 307/468 |
| 4,592,027 | 5/1986 | Masaki | 365/203 |
| 4,703,453 | 10/1987 | Shinoda et al. | 365/104 |
| 4,707,718 | 11/1987 | Sakai et al. | 357/45 |
| 4,709,351 | 11/1987 | Kajigaya | 365/182 |
| 4,839,860 | 6/1989 | Shinoda et al. | 365/104 |
| 4,949,309 | 8/1990 | Rao | 365/104 |
| 4,989,062 | 1/1991 | Takahashi et al. | 357/45 |
| 4,990,999 | 2/1991 | Oishi et al. | 357/45 |

FOREIGN PATENT DOCUMENTS 0302659 2/1989 European Pat. Off.

OTHER PUBLICATIONS

Okada, et al.; "16 Mb ROM Design Using Bank Select Architecture"; Symposium on ULSI Circuits; Tokyo, Japan, Aug. 22-24, 1988; Digest of Technical Papers, pp. 85-86.

Primary Examiner—Joseph E. Clawson, Jr.
Attorney, Agent, or Firm—Fliesler, Dubb, Meyer & Lovejoy

[57] ABSTRACT

A flat-cell ROM array reduces the number of block select transistors utilized, allows for the layout of straight metal lines, while sharing the metal lines between even and odd banks, and achieves very high density and high performance. Parallel buried diffusion regions are deposited in the substrate. A gate oxide is laid over the substrate. A plurality of polysilicon word lines are laid over the gate oxide perpendicular to the buried diffusion regions, so that the areas between the respective pairs of buried diffusion regions and under the polysilicon word lines, form columns of flat cell field effect transistors. An insulating layer is laid over the polysilicon word lines, and a plurality of metal bit lines and virtual ground lines is deposited. These metal lines are shared by even and odd columns of field effect transistors. Access to the metal lines is made through a plurality of LOCOS block select transistors connected to every other buried diffusion bit line. The alternate buried diffusion bit lines are connected through either a buried diffusion region to its left or a buried diffusion region to its right to the metal lines, by means of bank right and left select transistors.

18 Claims, 6 Drawing Sheets

FLAT-CELL READ-ONLY-MEMORY INTEGRATED CIRCUIT

BACKGROUND OF THE INVENTION

1. Field of the Invention

The present invention relates to read-only-memory (ROM) integrated circuit design, and particularly to high density, high performance read-only-memory circuits.

2. Background of the Invention

There are a number of basic ROM integrated circuit design approaches. One such approach has been referred to as the flat-cell design. The flat-cell design gives a very small area per storage unit cell (ROM cell) compared to other known design approaches.

In a flat-cell FET, unlike in the traditional LOCOS (Local Oxidation Silicon) approach to FET design, the width of the polysilicon word line defines the channel width of the FET, rather than the channel length. This allows a designer to pack the polysilicon lines in the ROM cores purely from the point of view of process limitations, rather than the FET device's physical limitations. Also, because there is no thermally grown field oxide in the core ROM cell region, there is no channel width reduction due to thermal field dopant encroachments, and no packing density loss due to birdsbeaks in the field oxide. This allows the very dense core array to be achieved.

However, the size of the ROM cell alone does not determine the size of ROM array formation. The circuitry required to access the ROM cell and other peripheral circuits also contribute to the overall size of the array.

Also, in a flat-cell ROM, the bit lines are accomplished with buried diffusion, which have relatively high resistance and capacitance associated with them. Thus, it is difficult to drive the buried diffusion lines quickly. In order to get around the speed problem with the buried diffusion bit lines, metal lines running parallel with the buried diffusion lines, and making contacts with them every so often are used in the prior art. However, the core ROM cell pitch becomes limited by the metal and contact pitches, rather than the basic transistor pitches, and loses packing advantages.

A prior art flat-cell ROM design can be found in Okada, et al., "16 Mb ROM Design Using Bank Select Architecture", Symposium on VLSI Circuits, Tokyo, Japan, Aug. 22-24, 1988, Digest of Technical Papers, on pp. 85-86. In the Okada publication, the flat-cell ROM array uses a bank select architecture, in which the basic ROM cells are NOR-connected flat-cell FETs laid out in columns. The bit lines are implemented as buried diffusion lines for each array. Metal lines corresponding to the data line and virtual ground are laid out over the ROM array, and connected to the buried diffusion bit lines through flat-cell FET bank select transistors, and metal-to-diffusion contacts. See also, European Patent Application No. 88306931.2 entitled "Semiconductor Memory Device and Process for Producing Same," by Ashida, et al., published Feb. 8, 1989.

In the Okada, et al., publication, each column of transistors in a local sub-array defines a bank. Each bank of transistors shares a metal data line and a metal virtual ground line with another bank. The ROM is laid out such that bank 0 and bank 1 share a virtual ground line, while banks 1 and 2 share a metal data line, banks 2 and 3 share the next virtual ground line, and so on. Each buried diffusion region in the Okada, et al. flat-cell ROM has a first bank transistor for connecting to the adjacent metal data line, and a second bank select transistor for connecting to the adjacent metal virtual ground line.

In the Okada design, the metal lines in the ROM array are not straight. Rather, they are laid out so that the metal at a first end of the column is aligned with a bank select transistor for the even bank, and the metal at the second end of the column is aligned with the bank select transistor for the odd bank. Also, the Okada design calls for one diffusion-to-metal contact per diffusion bit line. This crooked metal line, in particular, has an undesirable effect on yield of the integrated circuits because of difficulty in reliably laying out crooked conductors.

It is desirable to design a high performance ROM, while maintaining high packing densities offered by the flat-cell design technique, which can be manufactured with high yield.

SUMMARY OF THE INVENTION

The present invention provides a flat-cell ROM array which overcomes many of the problems of the prior art, by using isolated block select transistors, allowing for the layout of straight metal lines, while sharing the metal lines between even and odd banks, and achieving a very high density, high performance ROM.

The invention can be characterized as a memory circuit which comprises a semiconductor substrate. A plurality of parallel buried diffusion regions are deposited in the substrate to form local bit lines. A gate oxide is laid over the substrate. A plurality of polysilicon word lines are laid over the gate oxide perpendicular to the local bit lines, so that the areas between the respective pairs of buried diffusion regions and under the polysilicon word lines form channels of field effect transistors, whereby a column of ROM cells lies between each pair of buried diffusion local bit lines. An insulating layer is laid over the polysilicon word lines, and a plurality of metal data lines and virtual ground lines (global bit lines) is deposited. These metal lines are shared by even and odd columns of ROM cells, yet may be laid out straight.

Access to the metal lines from the local bit lines is made through a plurality of block select transistors, each having a drain connected to one of themetal lines, a source coupled to an adjacent one of the local bit lines, and a gate connected to receive a block select signal across a block select line. These block select transistors are implemented using LOCOS technology, or other technology which provides for isolating the block select transistor, to allow for faster switching.

According to one aspect of the invention, the block select transistors connect every other local bit line to the metal lines, with the alternate local bit lines coupled to local bit lines on the left and right with fixed coded flat-cell transistors termed bank select transistors. In response to left or right bank select signals, the alternate local bit line can be coupled to a virtual ground line or metal data line by way of a bank select transistor and the local bit line on its left or its right which is connected to the desired metal line by a block select transistor.

According to another aspect of the invention, isolated block select transistors are connected to each end of the alternate local bit lines for higher speed applications.

In summary, a new ROM array design technique has been provided. The ROM array uses flat-cell transistors in a virtual ground configuration to achieve very high density. The manner in which the ROM array is divided into sub-arrays achieves very high performance. The local diffused bit line structure achieves an easy interface to each bank of ROM cells, for easy processing and high yield.

The sub-arrays of flat-cells are selected by fully decoded block select lines through conventional isolated select transistors. Inside each sub-array, two fix coded rows of flat-cells decode left and right banks for access to shared straight metal bit lines.

Other aspects and advantages of the present invention can be seen upon review of the figures, the detailed description, and the claims which follows.

DETAILED DESCRIPTION OF THE PREFERRED EMBODIMENT

Figure 1:
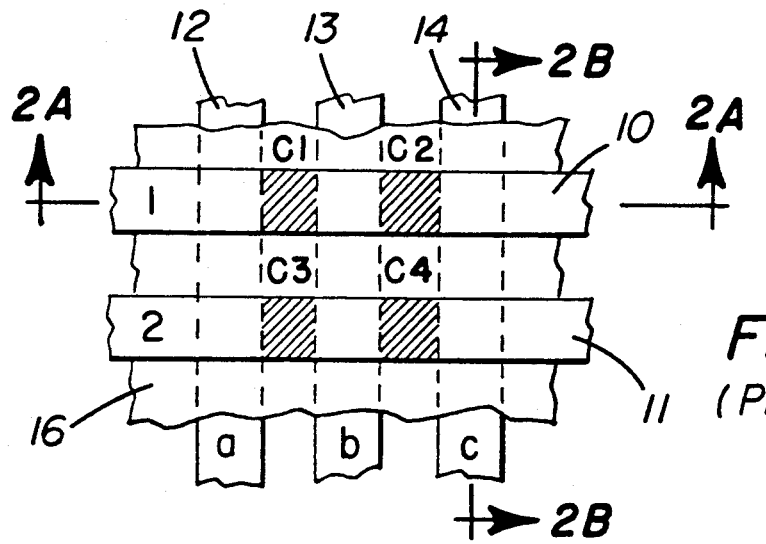
FIG. 1 is a schematic top view of the layout of a prior art flat-cell ROM core.
Figure 3:
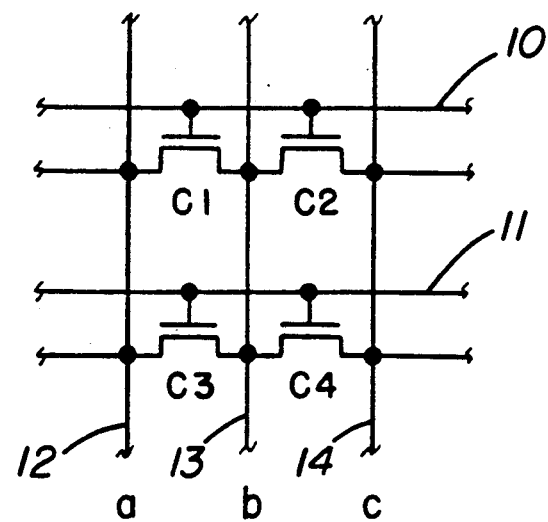
FIG. 3 is a circuit diagram of the prior art flat-cell ROM array illustrated in FIG. 1.
Figure 4:
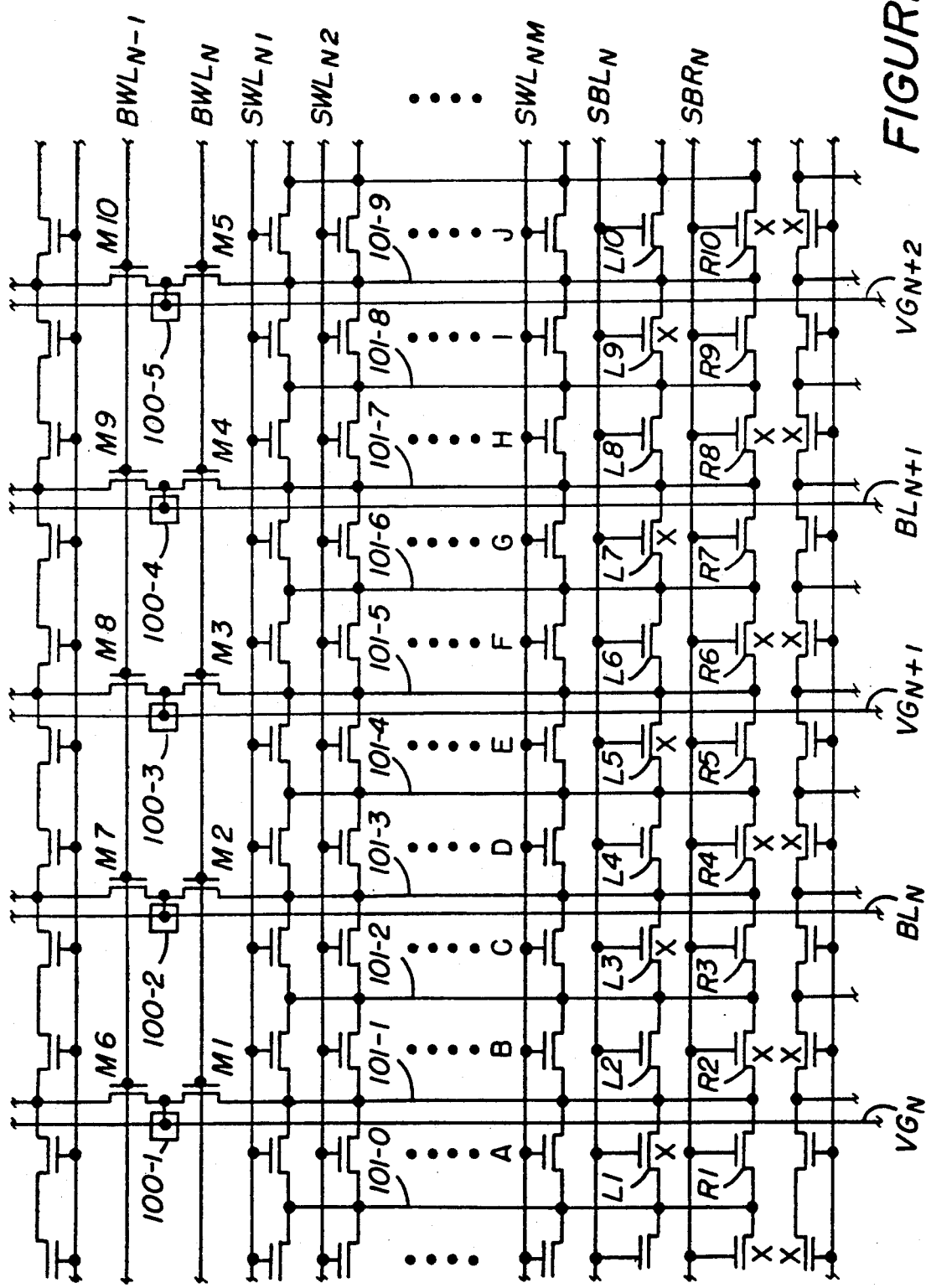
FIG. 4 is a circuit diagram of a ROM sub-array according to the present invention.
Figure 5:
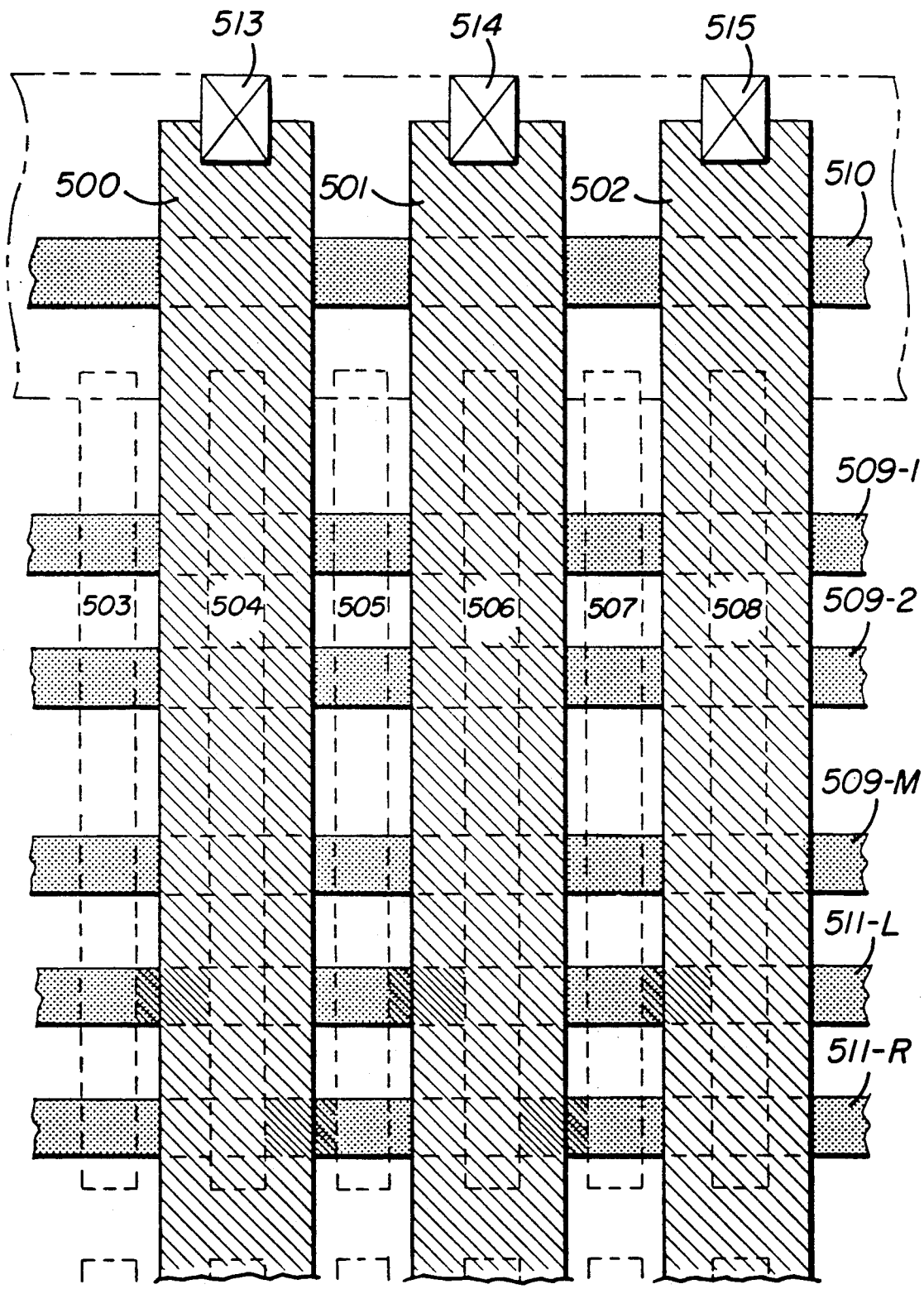
FIGS. 5, 6, and 7 illustrate the manufacturing process for implementing the flat-cell ROM, with isolated bank select transistors and shared metal global bit lines, according to the present invention.
Figure 6:
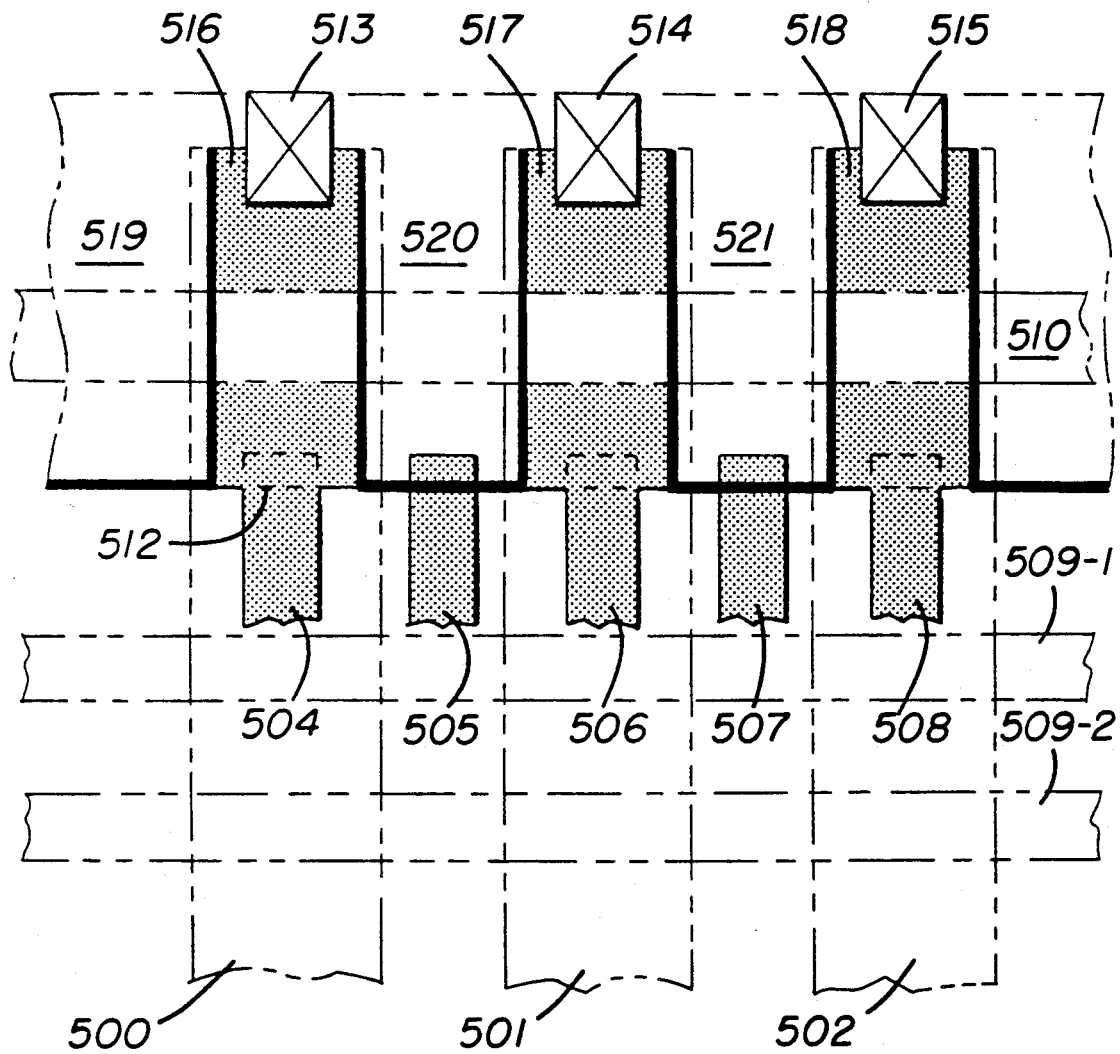
Figure 7:
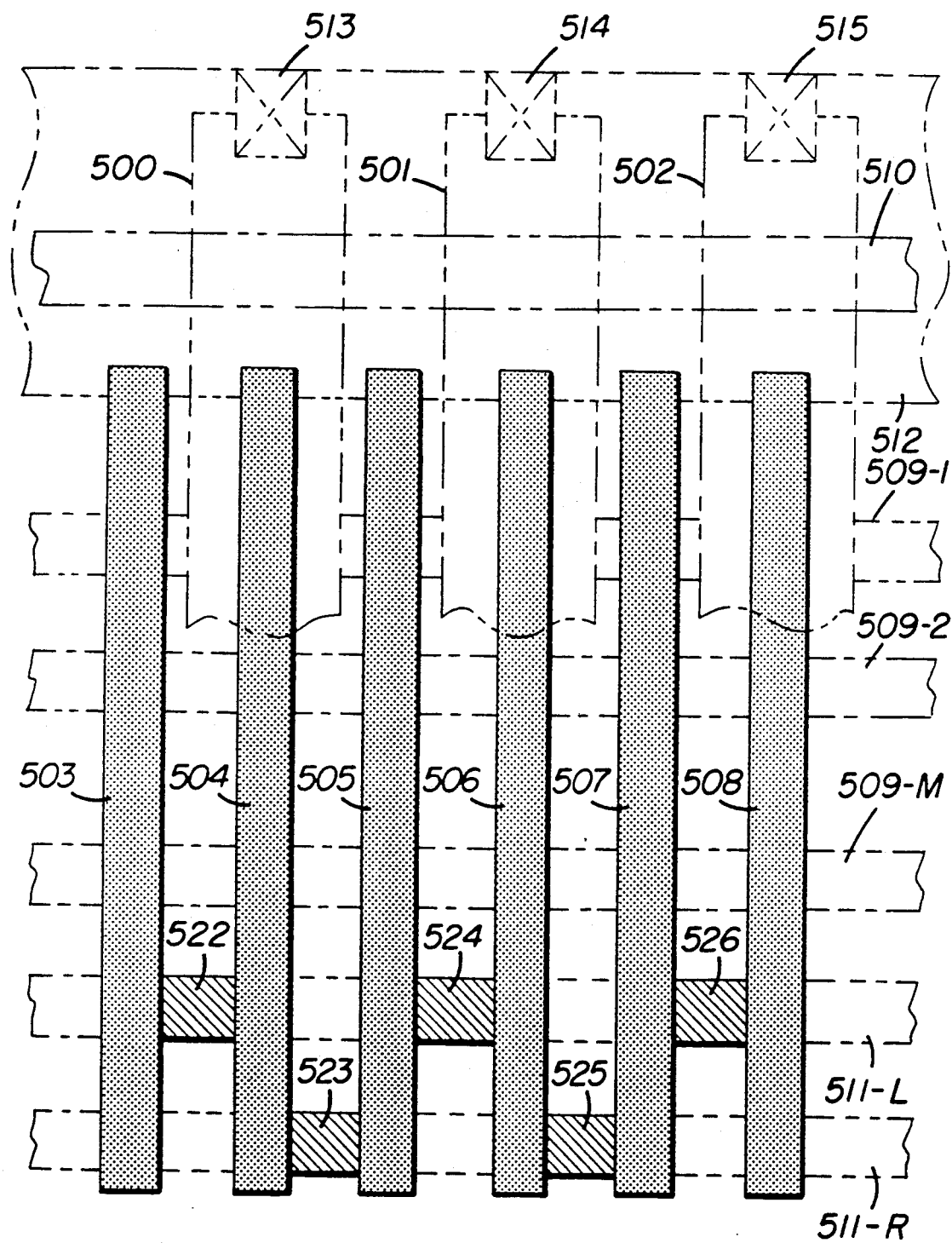
Figure 8:
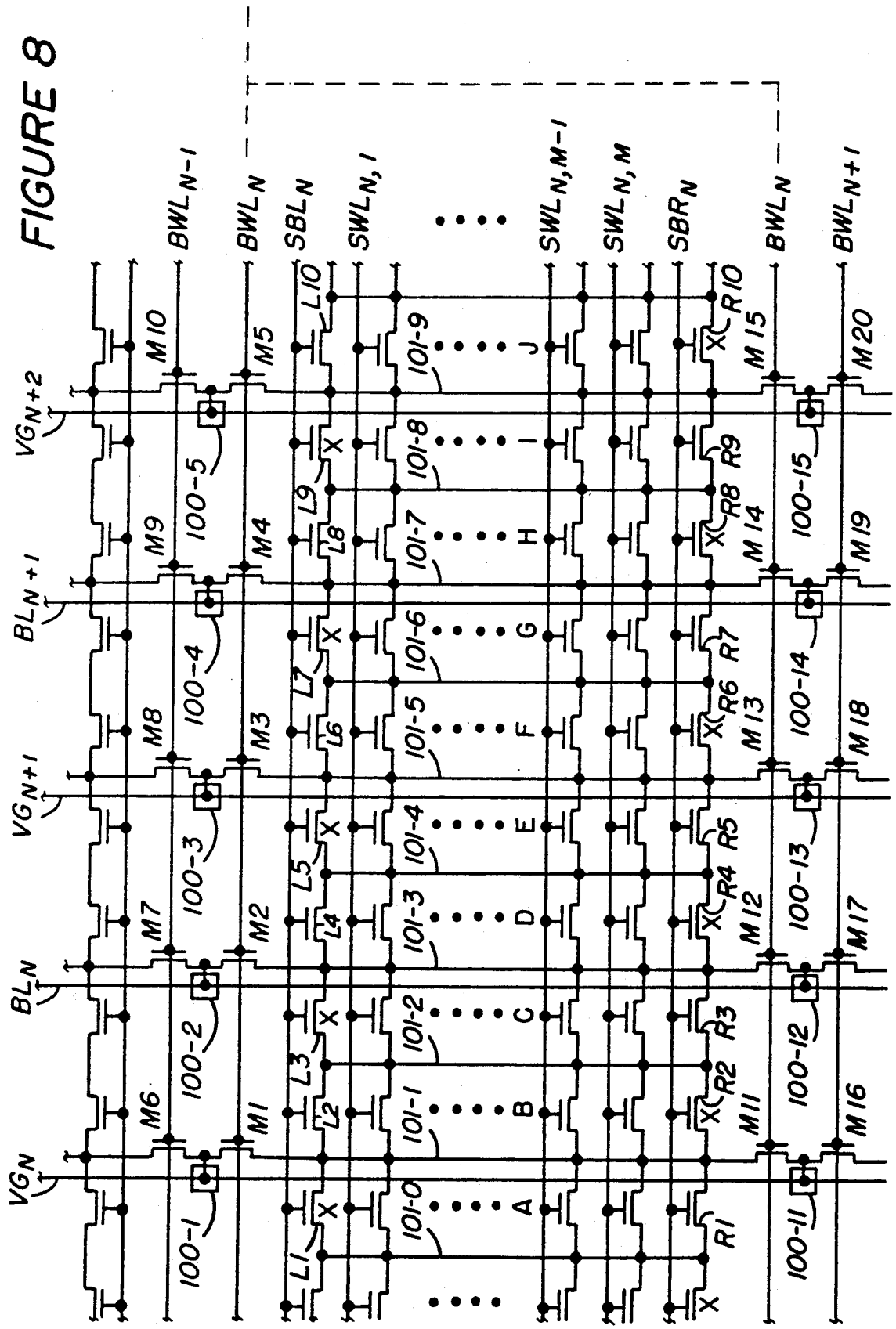
FIG. 8 is a circuit diagram of an alternate ROM subarray according to the present invention.

A detailed description of the preferred embodiments of the present invention is described with reference to FIGS. 1-8. FIGS. 1-3 illustrate the flat-cell ROM layout and basic circuit of the prior art. FIG. 4 is a schematic diagram of one ROM sub-array according to the present invention. FIGS. 5-7 illustrate the layout of the ROM sub-array according to the present invention. FIG. 8 is a schematic diagram of a ROM sub-array according to the present invention with isolated block select transistors on each end of the local bit lines.

I. Flat Cell Design

The manufacturing technique for the flat-cell is illustrated in FIGS. 1, 2A, 2B, and 3. In FIG. 1, a schematic diagram of the layout from the top view of four-transistor flat-cell array is shown. The horizontal bars 10 and 11 are polysilicon word lines. The vertical bars 12, 13, and 14, are buried n+ diffusion regions. The regions C1, C2, C3 and C4 are the gate/channel regions of respective flat-cell transistors which store data, and form the ROM cell storage unit. In order to store 1 or 0 in each of the transistors, a mask ROM technique is used to lay down low enhancement or high enhancement type channels.

Figure 2A:
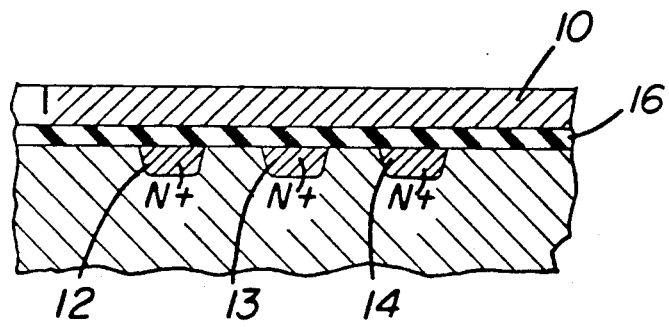
FIGS. 2A and 2B show cross sectional views of the prior art flat-cell ROM core illustrated in FIG. 1.
Figure 2B:
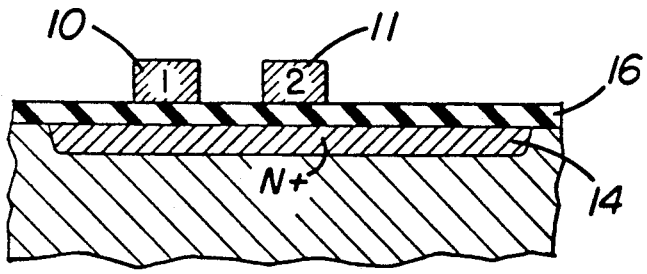

FIGS. 2A and 2B are cross sectional views of the flat-cell array of FIG. 1. FIG. 2A shows a cross section taken along the line 2A—2A in the polysilicon word line 10. As can be seen, the buried diffusion lines 12, 13, and 14 are deposited in the silicon substrate. A thin gate oxide 16 is deposited over the silicon substrate. Then polysilicon word lines are deposited over the gate oxide.

FIG. 2B shows a cross section of the array of FIG. 1, taken through along the line 2B—2B in the buried diffusion region 14. This illustrates the buried diffusion region 14 as a continuous n+ doped conductive bit line along the array. The gate oxide 16 is laid down over the buried diffusion regions, and the polysilicon word lines 10, 11 are deposited over the gate oxide.

FIG. 3 is a circuit diagram which represents the flat-cell structure, in which lines 10 and 11 correspond to the polysilicon word lines 10 and 11 of FIG. 1. Lines 12, 13, and 14 correspond to the buried diffusion bit lines 12, 13, and 14 in FIG. 1. The transistors M1, M2, M3, and M4 are defined by the gate regions which are doped by using mask programming techniques to store by ROM code implants either 1 or 0.

II. ROM Sub-Array Circuit

FIG. 4 is a circuit diagram of a ROM sub-array according to one embodiment of the present invention. The sub-array, designated N, includes a plurality of block select transistors M1-M5, implemented using LOCOS FET techniques so that they have good isolation from other components in the integrated circuit, and therefore, low capacitive loading and high switching speeds. Each block select transistor is coupled to a metal to diffusion contact 100-1 through 100-5 at its drain; its gate is connected to a block select word line $BWL_N$; and its source is coupled to a buried diffusion bit line 101-1, 101-3, 101-5, 101-7, and 101-9. The contacts 100-1 through 100-5 couple the drains of the block select transistors M1-M5 to a metal virtual ground line $VG_N$ or a metal data line $BL_N$, such that the odd block select transistors M1, M3, M5 ... are coupled to $VG_N$ metal lines, and the even block select transistors M2, M4 ... are coupled to $BL_N$ metal lines.

The ROM cell array further includes the buried diffusion bit lines 101-0, 101-2, 101-4, 101-6 and 101-8, which are not coupled directly to block select transistors. Polysilicon word lines $SWL_{N1}$ through $SWL_{NM}$ are laid perpendicular to the buried diffusion regions 101-0 through 101-9. In this manner, a ROM array is defined such that the buried diffusion regions each serve as the source of a first column of ROM cells, and as the drain of a second column of ROM cells.

Buried diffusion regions 101-1, 101-3, 101-5, 101-7 and 101-9, which are connected through block select transistors M1-M5 to the respective metal lines, are coupled to the buried diffusion regions on their left and on their right through bank left and bank right fixed ROM implant flat-cells, located at the end of the buried diffusion region opposite the contact 100-1 through 100-5. These fixed bank left and bank right select transistors can be located anywhere along the bank.

The bank left select transistors are labelled L1–L10 in FIG. 4. In this fixed code, transistors L1, L3, L5, L7, L9 are all made with a ROM code implant, causing the threshold voltage to be greater than certain voltages, e.g., six volts, so that in effect, transistors L1, L3, L5, L7, and L9 are always considered off. The transistors L2, L4, L6, L8, and L10 have a low threshold voltage and are turned on and off in response to the $SBL_N$ signal.

Similarly, bank right select transistors are labelled R1–R10. Transistors R1, R3, R5, R7, and R9 have a low threshold voltage. Therefore, they are turned on and off in response to the $SBR_N$ signal. The transistors R2, R4, R6, R8, and R10 have a ROM code implant which sets the threshold voltage greater than certain voltages, so that they are always considered off.

The sub-array illustrated in FIG. 4 includes columns of ROM cells labelled A-J. The columns A, C, E, G, and I, which are to the left of the diffusion regions 101-1, 101-3, 101-5, 101-7 and 101-9, respectively, are all sampled when the $SBL_N$ is asserted. For instance, the column C is sampled because the buried diffusion region 101-2 is coupled through the transistor L2 to the diffusion region 101-1. Diffusion region 101-1 is connected through transistor M1 to the metal line $VG_N$. Diffusion region 101-3, which makes up the other side of column C, is connected directly to transistor M2 and to metal line $BL_N$. The metal lines $VG_N$ and $BL_N$ are connected to sense circuitry, not shown.

Similarly, columns B, D, F, H, and J, are all accessed in response to assertion of the $SBR_N$ signal. For instance, column D is accessed when the $SBR_N$ is asserted, because diffusion region 101-4 is coupled through bank right select transistor R5 to diffusion region 101-5, and through block select transistor M3 to the metal line $VG_{N-1}$. The diffusion region 101-3 is directly connected through block select transistor M2 to the metal line $BL_N$. The metal line $VG_{N-1}$ and $BL_N$ are connected to sense circuitry, not shown.

In sum, the local bit lines 101-1, 101-3, 101-5, 101-7, and 101-9 are connected through the fixed cells L1-L10 and R1-R10 to the local bit lines 101-0, 101-2, 101-4, 101-6, and 101-8. These local bit lines 101-1, 101-3, 101-5, 101-7, and 101-9 are connected to metal data lines via the block select transistors M1-M5, and metal to diffusion contacts 100-1 through 100-5. In this architecture, only every other buried diffusion region is connected directly to the metal data or virtual ground lines. Thus, two core cell pitches are allocated for each metal line pitch.

This architecture can be described in an index notation for a sub-array having N local bit lines as follows. It can be seen that there is a first plurality of isolated block select transistors M1, M3, M5, each having a drain connected to one of the global bit lines forming a virtual ground line, a source connected to a respective one of the local bit lines $LBL_{4k-1}$ for k equal to 0 through (N−1)/4, (101-1, 101-5, 101-9), and a gate connected to the block select line $BWL_N$.

Also there is a second plurality of isolated block select transistors M2, M4, each having a drain connected to one of the global bit lines forming metal bit lines, a source connected to a respective one of local bit lines $LBL_{4k-3}$, for k equal to 0 through (N−1)/4, (101-3, 101-7), and a gate connected to the block select line $BWL_N$.

Field oxide regions between adjacent block select transistors isolate the block select transistors.

The bank left select word line $BL_N$ and a bank right select word line $BR_N$ intersect the plurality of local bit lines and define bank left and bank right select transistors between each pair of local bit lines and under the bank left select and bank right select word lines. The bank left and bank right select transistors are fixed coded to couple local bit lines $LBL_4$, for j equal to 0 through (N−1)/2, (101-0, 101-2, 101-4 ...) to a virtual ground line through $LBL_{4k+1}$, for k equal to 0 through (N−1)/4, in response to energizing voltage on the bank left select word line and to couple local bit lines $LBL_4$, for j equal to 0 through (N−1)/2, to a data line through $LBL_{4k+3}$, for k equal to 0 through (N−1)/4, in response to energizing voltage on the bank right select word line.

As illustrated in FIG. 4, sub-array N−1 at the top of FIG. 4 has block select transistors M6-M10 coupled to the same contact points 100-1 through 100-5 as sub-array N. Similarly, sub-array N+1 at the bottom of FIG. 4 is arranged so that the fixed coded left and right bank select transistors are adjacent to the fixed coded left and right bank select transistors for array N. In this way, two sub-arrays share the same metal to diffusion contact, and an efficient layout for the overall chip is achieved. An alternative embodiment is illustrated in FIG. 8, as described below.

III. ROM Sub-Array Layout

FIGS. 5-7 illustrate the layout of the ROM cell array according to the embodiment of the present invention shown in FIG. 4. FIG. 5 highlights the metal lines, the metal to diffusion contacts, and the polysilicon word lines, which are superimposed on the buried diffusion regions. FIG. 6 highlights the contacts, and the block select transistors. FIG. 7 illustrates the layout of the local buried diffusion bit lines and the position of ROM code implants to establish the bank left and bank right selection. The layouts shown in the Figures are representative, and should be altered as suits the particular manufacturing process to be used.

As can be seen in FIG. 5, the metal lines 500, 501, and 502 are straight. Three metal lines 500, 501, and 502 are shared by six local buried diffusion bit lines 503-508. Also, the polysilicon word lines 509-1 through 509-M for the ROM cell array, the polysilicon word line 510 for the block select transistor and the polysilicon word lines 511-R and 511-L for the bank select transistors are shown. Diffusion to metal contacts 513, 514, and 515 are found at the top of FIG. 5.

FIG. 6 illustrates the implementation of the block select transistors. The polysilicon word line 510 for the block select transistor, the n+ implant region generally above line 512 which defines the block select transistors, and the active areas 516, 517, and 518 of such transistors are illustrated. Note that every other local buried diffusion region 504, 506, 508 extends into the source area of a block select transistor 516, 517, 518.

Also note that the channel length in the block select transistor is defined by the width of the polysilicon word line 510, which is one micron in the embodiment described. The channel width of these devices is defined by field oxide regions 519, 520, 521 between the active regions of the transistors. These oxides are grown using the LOCOS (Local Oxidation Silicon) process as is common for MOS FETs. See description in European Patent Application No. 88306931.2, cited in the Background section above.

FIG. 7 illustrates the layout of the local buried diffusion regions 503-507 and the ROM code implants 522-526 used for the "always off" left and right bank select transistors.

IV. Alternate ROM Sub-Array Circuit

FIG. 8 is a circuit diagram of a ROM sub-array according to an alternate embodiment of the present invention. This sub-array, designated N, includes a plurality of block select transistors M1-M5 and M11-M15, each implemented using LOCOS FET techniques so that they have good isolation from other components in the integrated circuit, and therefore, low capacitive loading and high speeds. Each block select transistor is coupled to a metal to diffusion contact 100-1 through 100-5 and 100-11 through 100-15, at its drain; its gate is connected to a block select word line $BWL_N$; and its source is coupled to a buried diffusion bit line 101-1, 101-3, 101-5, 101-7, and 101-9. The contacts 100-1 through 100-5 couple the drains of the block select transistors M1-M5 to a metal virtual ground line $VG_N$ or a metal data line $BL_N$, such that the odd block select transistors, M1, M3, M5 . . . are coupled to $VG_N$ metal lines, and the even block select transistors M2, M4 . . . are coupled to $BL_N$ metal lines. Similarly, on the opposite end of the local bit lines, the contacts 100-11 through 100-15 couple the drains of block select transistors M11-M15 to a metal virtual ground line $VG_N$ or a metal data line $BL_N$, such that the odd bank select transistors M11, M13, M15 are coupled to the same virtual ground line $VG_N$ as odd bank select transistors M1, M3, and M5. Similarly, the even block select transistors, M12, M14 . . . are coupled to the metal bit line $BL_N$, as are the even block select transistors M2 and M4.

The main difference between the embodiment of FIG. 4 and the embodiment of FIG. 8 resides in the use of block select transistors M11-M15 on the second end of the local bit lines. This increases the speed of the circuit significantly by reducing the average path length from a given ROM cell to a metal line. Note that the gates of all of the block select transistors M1-M5 and M11-M15 are coupled to a single block select word line $BWL_N$. Otherwise, this ROM sub-array operates in the same manner as the ROM sub-array described with respect to FIG. 4.

Another difference between the sub-arrays of FIGS. 4 and 8 is that the bank left select flat cell transistors L1-L10 are located at the top of the banks in FIG. 8, rather than next to the bank right select flat cells R1-R10, as shown in FIG. 4. This illustrates that these bank left and bank right flat cells can be located anywhere along the array.

Other components in the circuit are labelled with the same reference numbers as shown in FIG. 4 and are not described again here.

It can be seen that the block select transistors M6-M10 for sub-array N−1 are located at the top of FIG. 8, and the block select transistors M16-M20 for sub-array N+1 are located at the bottom of the array. This achieves optimum sharing of metal to diffusion contacts.

V. Conclusion

In sum, the present invention provides a new ROM array scheme using flat-cell technology in a NOR virtual ground configuration to achieve very high density. The ROM array is divided into sub-arrays. The sub-arrays of flat-cells are selected by fully decoded block select lines through conventional LOCOS block select transistors. Inside each sub-array, two fix coded rows of flat-cells are used to decode left and right columns of cells. Use of the local buried diffusion bit lines together with the flat-cell transistors achieves shared metal bit line access with straight metal lines, and compact layout.

Overall, a high density, high performance and high yield ROM integrated circuit has been presented.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. The embodiments were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

What is claimed is:

1. A memory circuit on a semiconductor substrate; comprising:
    a plurality of buried diffusion regions $LBL_k$ in the substrate, the regions forming lines in a section of the substrate;
    an insulating layer of essentially constant thickness over the section of the substrate;
    a first plurality of conductive strips $WL_m$ on the insulating layer, the first plurality of conductive strips forming lines intersecting the buried diffusion regions, so that regions between respective pairs of buried diffusion regions and under a conductive strip, form channels of field effect transistors, whereby a column of storage cells is formed between each pair of buried diffusion regions;
    a second plurality of conductive strips $ML_j$ isolated from the first plurality, the second plurality of conductive strips forming lines along the plurality of buried diffusion regions;
    code implants in the channels of the field effect transistors to define a conductive or a non-conductive state in response to a signal on the corresponding one of the first plurality of conductive strips;
    a plurality of block select transistors, each having a drain connected to one of the second plurality of conductive strips $ML_j$, a source connected to an adjacent one of the plurality of buried diffusion regions $LBL_k$, a gate connected to receive a block select signal; wherein alternate buried diffusion regions are connected to the source of respective block select transistors, and further including:
    means, coupled to each of said alternate buried diffusion regions $LBL_k$, for selectively coupling a buried diffusion region $LBL_{k-1}$ on one side or a buried diffusion region $LBL_{k+1}$ on an other side through said alternate buried diffusion region $LBL_k$ to the source of the respective block select transistor.

2. The memory circuit of claim 1, wherein the means for selectively coupling includes:
    a first conductive strip parallel to the first plurality of conductive strips so that regions between respective pairs of buried diffusion regions and under the first conductive strip, form channels of bank select field effect transistors for selecting banks on the one side of the alternate buried diffusion region; and
    a second conductive strip parallel to the first plurality of conductive strips so that regions between respective pairs of buried diffusion regions and under the second conductive strip, form channels of bank select field effect transistors for selecting banks on the other side of the alternate buried diffusion region.

3. The memory circuit of claim 1, wherein the second plurality of conductive strips comprise essentially straight conductors extending from the drains of respective block select transistors across all of the first plurality of conductive strips $WL_m$ in the section of the substrate.

4. The memory circuit of claim 1, wherein the first plurality of conductive strips comprises polysilicon.

5. The memory circuit of claim 1, wherein the second plurality of conductive strips comprises metal.

6. A memory circuit on a semiconductor substrate; comprising:
   a plurality of buried diffusion regions in the substrate, the regions forming essentially parallel lines in a section of the substrate;
   an insulating layer of essentially constant thickness over the section of the substrate;
   a first plurality of conductive strips on the insulating layer, the first plurality of conductive strips forming essentially parallel lines intersecting the buried diffusion regions, so that regions between respective pairs of buried diffusion regions and under a conductive strip, form channels of field effect transistors, whereby a column of field effect transistors is formed between each pair of buried diffusion regions;
   a second plurality of conductive strips isolated from the first plurality, the second plurality of conductive strips forming lines along the plurality of buried diffusion regions essentially straight across all of the first plurality of conduction strips in the section;
   code implants in the channels of the field effect transistors to define a conductive or a non-conductive state in response to an energizing voltage on the corresponding one of the first plurality of conductive strips;
   a plurality of block select transistors, each having a drain connected to one of the second plurality of conductive strips, a source connected to an adjacent one of the buried diffusion regions, a gate connected to receive a block select signal; and
   means, coupled to the plurality of buried diffusion regions, for selectively coupling two columns of field effect transistors to each one of the second plurality of conductive strips in response to select signals.

7. The memory circuit of claim 6, wherein the means for selectively coupling includes:
   code implants in the channels along a first one of the first plurality of conductive strips defining alternately conductive then non-conductive states to couple a first buried diffusion region to a center buried diffusion region, and isolate the center buried diffusion region from a third buried diffusion region, and couple the third buried diffusion region to a next center buried diffusion region, and so on within the section,
   code implants in the channels along a second one of the first plurality of conductive strips defining alternately non-conductive then conductive states to isolate the first buried diffusion region from the center buried diffusion region, and couple the center buried diffusion region to the third buried diffusion region, and isolate the third buried diffusion region from a next center buried diffusion region, and so on within the section, and
   wherein code implants in the channels along others of the first plurality of conductive strips define stored data; and
   the source of each of the plurality of block select transistors is coupled to one of the center buried diffusion regions.

8. The memory circuit of claim 6, wherein the first plurality of conductive strips comprises polysilicon.

9. The memory circuit of claim 6, wherein the second plurality of conductive strips comprises metal.

10. A memory circuit on a semiconductor substrate; comprising:
    a plurality of local bit lines $LBL_n$, for n equal to 0 through N−1, each comprising a buried diffusion region in the substrate;
    an insulating layer of essentially constant thickness over the local bit lines;
    a plurality of word lines $WL_m$, for m equal to 1 through M, on the insulating layer, the plurality of word lines intersecting the local bit lines, so that regions between respective pairs of local bit lines and under word lines, form channels of field effect transistors, whereby a column of flat cell ROM storage units is formed between each pair of local bit lines;
    a plurality of global bit lines isolated from the plurality of word lines, the global bit lines comprising essentially straight conductive strips for a length extending across the plurality of word lines $WL_m$, for m equal to 1 through M, a first subset of the global bit lines forming data lines and a second subset of the global bit lines forming virtual ground lines;
    a block select line;
    a first plurality of block select transistor, each having a drain connected to one of the global bit lines forming data lines, a source connected to a respective one of the local bit lines $LBL_{4k-1}$, for k equal to 0 through (N−1)/4, and a gate connected to the block select line;
    a second plurality of block select transistors, each having a drain connected to one of the global bit lines forming virtual ground lines, a source connected to a respective one of local bit lines $LBL_{4k-3}$, for k equal to 0 through (N−1)/4, and a gate connected to the block select line; and
    a bank left select word line and a bank right select word line, on the insulating layer, intersecting the plurality of local bit lines and defining bank left and bank right select transistors between each pair of local bit lines and under the bank left select and bank right select word lines; wherein
        the bank left and bank right select transistors are fixed coded to couple local bit lines $LBL_{2j}$, for j equal to 0 through (N−1)/2, to a data line through another local bit line $LBL_{2j\pm 1}$ in response to energizing voltage on the bank left select word line, or to couple local bit lines $LBL_{2j}$, for j equal to 0 through (N−1)/2, to a virtual ground line through another local bit line $LBL_{2j\pm 1}$ in response to energizing voltage on the bank right select word line.

11. The memory circuit of claim 10, wherein the word lines comprise polysilicon strips.

12. The memory circuit of claim 10, wherein the global bit lines comprise metal strips.

13. The memory circuit of claim 10, further including:
    a third plurality of block select transistors, each having a drain connected to one of the global bit lines forming data lines, a source connected to respective ones of the local bit lines $LBL_{4k+1}$, for k equal to 0 through (N−1)/4, and a gate connected to the block select line; and
    a fourth plurality of block select transistors, each having a drain connected to one of the global bit lines forming virtual ground lines, a source connected to a respective one of local bit lines $LBL_{4k-3}$, for k equal to 0 through $(N-1)/4$, and a gate connected to the block select line.

14. A memory circuit on a semiconductor substrate; comprising:
a plurality of memory sub-arrays;
means for generating block select signals indicating selected sub-arrays;
wherein at least one of said sub-arrays comprises
a plurality of buried diffusion regions $LBL_k$, for k equal to 1 through N, in the substrate, the regions forming local bit lines $LBL_k$ in a section of the substrate;
an insulating layer of essentially constant thickness over the section of the substrate;
a first plurality of conductive strips $WL_m$ on the insulating layer, the first plurality of conductive strips forming lines intersecting the buried diffusion regions, so that regions between respective pairs of buried diffusion regions and under a conductive strip, form channels of field effect transistors, whereby a column of storage cells is formed between each pair of buried diffusion regions;
a second plurality of conductive strips $ML_j$ isolated from the first plurality, the second plurality of conductive strips forming lines along the plurality of buried diffusion regions;
code implants in the channels of the field effect transistors to define a conductive or a non-conductive state in response to a signal on the corresponding one of the first plurality of conductive strips;
a first plurality of block select transistors, each having a drain connected to one of the second plurality of conductive strips $ML_j$, a source connected to an adjacent one of the plurality of buried diffusion regions $LBL_{2k}$, for k equal to 1 through N/2, near a first end of the buried diffusion region, a gate connected to receive a block select signal indicating the one sub-array; and
a second plurality of block select transistors, each having a drain connected to one of the second plurality of conductive strips $ML_j$, a source connected to an adjacent one of the plurality of buried diffusion regions $LBL_{2k}$, for k equal to 1 through N/2, near a second end of the buried diffusion region, a gate connected to receive the block select signal indicating the one sub-array;
wherein alternate buried diffusion regions are connected to the sources of respective block select transistors in the first and second pluralities of block select transistors, and further including;
means, coupled to each of said alternate buried diffusion regions $LBL_{2k}$, for selectively coupling a buried diffusion region $LBL_{2k-1}$ on one side or a buried diffusion region $LBL_{2k+1}$ on an other side through said alternate buried diffusion region $LBL_{2k}$ to the sources of the respective block select transistors.

15. The memory circuit of claim 14, wherein the means for selectively coupling includes:
a first conductive strip parallel to the first plurality of conductive strips so that regions between respective pairs of buried diffusion regions and under the first conductive strip, form channels of bank select field effect transistors for selecting banks on the one side of the alternate buried diffusion region; and
a second conductive strip parallel to the first plurality of conductive strips so that regions between respective pairs of buried diffusion regions and under the second conductive strip, form channels of bank select field effect transistors for selecting banks on the other side of the alternate buried diffusion region.

16. The memory circuit of claim 14, wherein the second plurality of conductive strips comprises essentially straight conductors extending from the drain of respective block select transistor in the first plurality to the drain of a respective block select transistor in the second plurality.

17. The memory circuit of claim 14, wherein the first plurality of conductive strips comprises polysilicon.

18. The memory circuit of claim 14, wherein the second plurality of conductive strips comprises metal.

* * * * *